United States Patent
Siskind

(10) Patent No.: US 6,693,630 B1
(45) Date of Patent: Feb. 17, 2004

(54) METHOD OF DETERMINING THE STABILITY OF TWO DIMENSIONAL POLYGONAL SCENES

(75) Inventor: Jeffrey Mark Siskind, Lawrenceville, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 0 days.

(21) Appl. No.: 09/613,957

(22) Filed: Jul. 11, 2000

(51) Int. Cl.$^7$ .............................................. G06F 15/00
(52) U.S. Cl. ...................................................... 345/419
(58) Field of Search ............................... 345/473, 474, 345/475, 419; 700/90

(56) References Cited

U.S. PATENT DOCUMENTS 6,044,306 A * 3/2000 Shapiro et al. ................. 700/90
6,243,106 B1 * 6/2001 Regh et al. ................... 345/473

OTHER PUBLICATIONS

Bailey, D., et al., "Extending Embodied Lexical Development", Proceedings of the 20th Annual Conference of the Cognitive Science Society, 1998.

Regier, T.P., "The acquisition of lexical semantics for spatial terms: A connectionist model of perceptual categorization" Ph.D. Thesis, University of California et Berkeley, 1992.

Siskind, J.M., et al., "A Maximum–Likelihood Approach to Visual Event Classification", Proceedings of the Fourth European Conference on Computer Vision, pp. 347–360, 1996.

Starner, T.E., "Visual Recognition of American Sign Language Using Hidden Markov Models", Master's Thesis, Massachusetts Institute of Technology, Cambridge, MA, pp. 2–52, 1995.

Talmy, L., "Force Dynamics in Language and Cognition", Cognitive Science, vol. 12, pp. 49–100, 1998.

Yamata, J., et al., "Recognizing Human Action in Time–Sequential Images using Hidden Markov Model", Proceedings of the IEEE Conference in Computer Vision and Pattern Recognition, pp. 379–385, 1992.

(List continued on next page.)

*Primary Examiner*—Phu K. Nguyen
(74) *Attorney, Agent, or Firm*—Scully, Scott, Murphy & Presser

(57) ABSTRACT

A method for determining the stability of a two dimensional polygonal scene. Each polygon in the scene includes data representing a set L of line segments comprised of individual line segments l. The method determines whether the line segments are stable under an interpretation I. I is a quintuple $(g, \leftrightharpoons_i, \leftrightharpoons_j, \leftrightharpoons_\theta, \bowtie)$ and g is a property of line segments while $\leftrightharpoons_i, \leftrightharpoons_j, \leftrightharpoons_\theta$, and $\bowtie$ are relations between pairs of line segments. The method includes the steps of: initializing a set Z of constraints and to an empty set; for each l contained in L, if g(l), instantiating $[\dot{c}(l)=0]$ and $[\theta(l)=0]$ and adding them to Z; for each $l_i, l_j$ contained in L, if $l_i \leftrightharpoons_i l_j$ instantiating $[\dot{\rho}(I(l_i, l_j), l_j)=0]$ between $l_i$ and $l_j$ and adding it to Z; for each $l_i, l_j$ contained in L, if $l_i \leftrightharpoons_j l_j$ instantiating $[\dot{\rho}(I(l_i, l_j), l_j)=\mathbf{0}]$ between $l_i$ and $l_j$ and adding it to Z; for each $l_i, l_j$ contained in L, if $l_i \leftrightharpoons_\theta l_j$, instantiating $[\theta(l_i)=\theta(l_j)]$ between $l_i$ and $l_j$ and adding it to Z; for each $l_i, l_j$ contained in L, if $l_i \bowtie l_j$ instantiating $[\dot{\rho}(l_i)\cdot\sigma \leq \dot{i}_j(\rho(p(l_i),l_j))\cdot\sigma]$ between $l_i$ and $l_j$ and adding it to Z; instantiating $[\dot{E}=-1]$ between all l of L and adding it to Z; and determining the stability of the scene based upon whether Z has a feasible solution. Also provided are a program storage device and computer program product for carrying out the method of the present invention.

15 Claims, 11 Drawing Sheets

OTHER PUBLICATIONS

Bobick, A.F., et al., "Action Recognition Using Probabilistic Parsing", Proceedings of the IEEE Computer Society Conference on Computer Vision and Pattern Recognition, pp. 196–202, 1998.

McCarthy, J., "Circumscription—A Form of Non–Monotomic Reasoning", Artificial Intelligence, vol. 13, pp. 27–39, 1980.

Blum, M., et al. "A Stability Test For Configurations Of Blocks", Artificial Intelligence Memo No. 188, pp. 1–31, 1970.

Brand M., et al., "Sensible Scenes: Visual Understanding of Complex Structures through Casual Analysis", Proceedings of the Eleventh National Conference on Artificial Intelligence, pp. 588–593, 1993.

Fahlman, S.E., "A Planning System for Robot Construction Tasks", Artificial Intelligence, vol. 5, pp. 1–49, 1974.

Mann, R., "The Computational Perception Of Scene Dynamics", Ph.D. Thesis, University of Toronto, 1998.

Mann, R., et al., "Towards the Computational Perception of Action", Proceedings of the IEEE Computer Science Conference on Computer Vision and Pattern Recognition, pp. 794–799, 1998.

Mann, R., et al., "The Computational Perception of Scene Dynamics", Computer Vision and Image Understanding, vol. 65, No. 2, pp. 113–128, 1997.

Mann, R., et al., "The Computational Perception of Scene Dynamics", Proceedings of the Fourth European Conference on Computer Vision, 1996.

Siskind, J.M., "Naive Physics, Event Perception, Lexical Semantics, and Language Acquisition", Ph.D. Thesis, Massachusetts Institute of Technology, 1992.

Siskind, J.M., "Grounding Language in Perception", Proceedings of the Annual Conference of the Society of Photo–Optical Instrumentation Engineers, Boston, MA 1993.

Siskind, J.M., "Axiomatic Support for Event Perception", Proceedings of the AAAI–94 Workshop on the Integration of Natural Language and Vision Processing, 1994.

* cited by examiner

METHOD OF DETERMINING THE STABILITY OF TWO DIMENSIONAL POLYGONAL SCENES

BACKGROUND OF THE INVENTION

1. Field of the Invention

The present invention relates generally to a method for determining the stability of two dimensional polygonal scenes and, more particularly, to a kinematics based method for determining the stability of two dimensional polygonal scenes which designates each scene in a sequence of scenes as either stable or unstable.

2. Prior Art

Methods are known in the art for determining the stability of a collection of blocks. These methods differ from the one presented here in that these prior methods use an approach based on dynamics whereas the method presented herein is based on kinematics.

Kinematics is a branch of mechanics which deals with the motion of a physical system without reference to the forces which act on that system and without reference to the precise velocities and accelerations of the components of that system. A kinematic model takes the form of a set of constraints which specify the allowed combinations of positions of system components. The allowed motions follow from the possible transitions between allowed positions.

In contrast, dynamics is a branch of mechanics which deals with the motion of a physical system under the influence of forces applied to the components of that system. A dynamic model takes the form of a set of constraints which specify the relation between the positions of system components and the forces on those components. The motions follow by relating forces on system components to accelerations of those components and, in turn, to velocities and positions of those components.

Methods are also known in the art for determining the stability of a collection of line segments and circles. These methods differ from the one presented here in that they are based on a naive physical theory rather than on kinematics. Yet other methods are known in the art for determining the stability of a collection of line segments and circles. While these methods are based on kinematics, they have some fundamental flaws which lead them to produce incorrect results. Lastly, still another method is known in the art for determining the stability of a collection of rectangles. This method differs from the one presented herein in that it is based on a heuristic that does not always work.

SUMMARY OF THE INVENTION

Therefore it is an object of the present invention to provide a method for determining stability of two dimensional polygonal scenes which overcomes the problems of the prior art.

Accordingly, a method for determining the stability of a two dimensional polygonal scene is provided. Each polygon in the scene includes data representing a set L of line segments comprised of individual line segments l. The method determines whether the line segments are stable under an interpretation I. I is a quintuple (g, $\leftrightarrows_i$, $\leftrightarrows_j$, $\leftrightarrows_\theta$, $\bowtie$) and g is a property of line segments while $\leftrightarrows_i$, $\leftrightarrows_j$, $\leftrightarrows_\theta$, and $\bowtie$ are relations between pairs of line segments. The method comprises the steps of: initializing a set Z of constraints to an empty set; for each l contained in L, if g(l), instantiating [$\ddot{c}(l)=0$] and [$\ddot{\theta}(l)=0$] and adding them to Z; for each $l_i$, $l_j$ contained in L, if $l_i \leftrightarrows_i l_j$, instantiating [$\dot{\rho}(I(l_i, l_j), l_j)=0$] between $l_i$ and $l_j$ and adding it to Z; for each $l_i$, $l_j$ contained in L, if $l_i \leftrightarrows_j l_j$, instantiating [$\dot{\rho}(I(l_i, l_j), l_j)=0$] between $l_i$ and $l_j$ and adding it to Z; for each $l_i$, $l_j$ contained in L, if $l_i \leftrightarrows_\theta l_j$, instantiating [$\dot{\theta}(l_i)=\dot{\theta}(l_j)$] between $l_i$ and $l_j$ and adding it to Z; for each $l_i$, $l_j$ contained in L, if $l_i \bowtie l_j$, instantiating [$\ddot{\rho}(l_i) \cdot \sigma \leq \ddot{l}_j(\rho(p(l_i),l_j)) \cdot \sigma$] between $l_i$ and $l_j$ and adding it to Z; instantiating [$\ddot{E}=-1$] between all l of L and adding it to Z; and determining the stability of the scene based upon whether Z has a feasible solution.

Also provided are a computer program product and program storage device for carrying out the method of the present invention and for storing a set of instructions to carry out the method of the present invention, respectively.

BRIEF DESCRIPTION OF THE DRAWINGS

These and other features, aspects, and advantages of the methods of the present invention will become better understood with regard to the following description, appended claims, and accompanying drawings where:

DETAILED DESCRIPTION OF THE PREFERRED EMBODIMENT

Although this invention is applicable to numerous and various types of scenes, it has been found particularly useful in the environment of scenes generated by placing polygons around objects in a video frame. Therefore, without limiting the applicability of the invention to scenes generated by placing polygons around objects in a video frame, the invention will be described in such an environment.

For the purposes of this direction, a scene is defined as a set of polygons having a relationship to one another. Each polygon is represented by a number of line segments, each line segment having two endpoints. Preferably, the scenes are generated by taking a video sequence as input and outputting a sequence of scenes, one scene for each video input frame. Each scene consists of a collection of convex polygons placed around the objects in the corresponding image.

Figure 1:
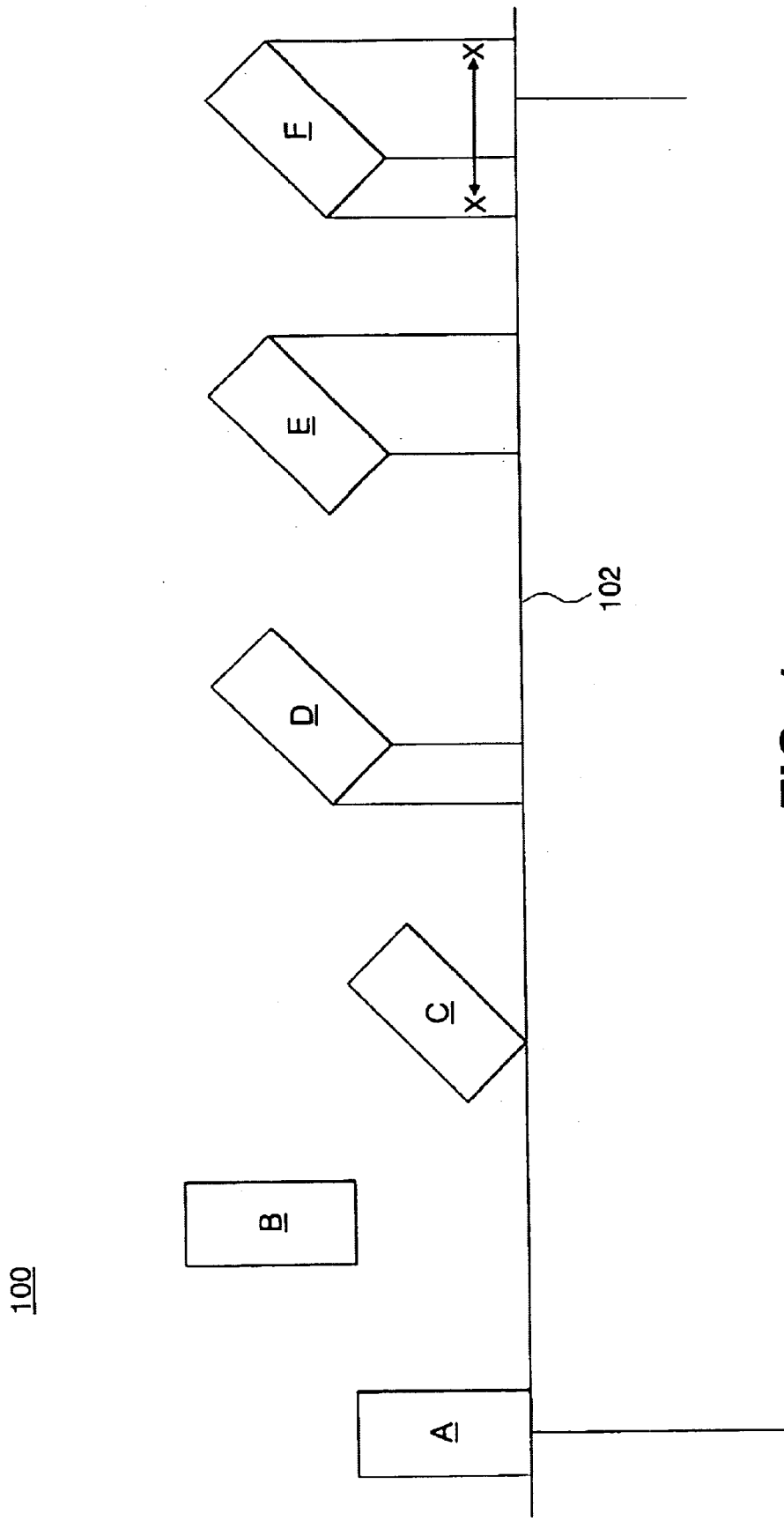
FIG. 1 is a schematic diagram depicting various support relations of blocks A, B, C, D, E, and F shown in the Figure.

Referring now to FIG. 1, there is illustrated a scene 100 having a polygons A–F in various positions in relation to a table top 102. If one were to look at the scene 100 in FIG.

1, he or she would say that polygon A is supported by the table top 102, and hence will not fall, while polygon B is unsupported, and hence will fall. Humans have the ability to make stability judgments. The method of the present invention presents a way that such judgments can be made artificially, such as by a computer (not shown).

In FIG. 1, polygon A is supported by virtue of the fact that it is above and in contact with the table top 102. This alone is not sufficient to guarantee stability, for polygon C is also above and in contact with the table top 102 yet is not stable because it can rotate either clockwise or counterclockwise. An object may require more than one source of support. For example, in FIG. 1, polygons D and E are not stable, because they can slide off their pedestals, while F is stable. Thus determining the stability of a scene requires analyzing the degrees of freedom of motion of the polygons in the scene and showing that no polygon can move under the force of gravity.

Figure 2A:
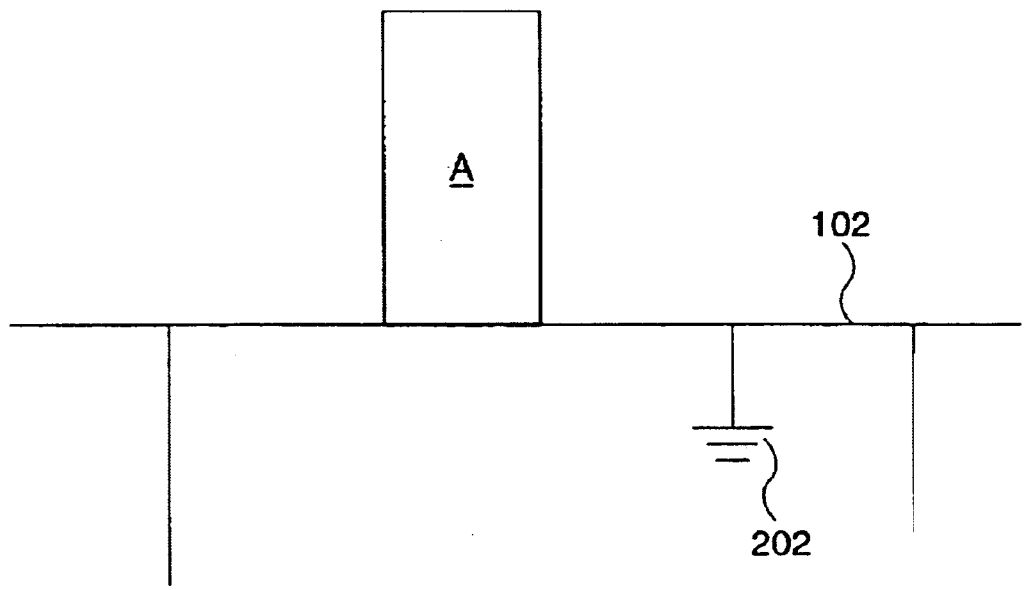
FIGS. 2(a) and 2(b) are schematic diagrams of the same scene but with different ground relationships and therefore different stability interpretation.
Figure 2B:
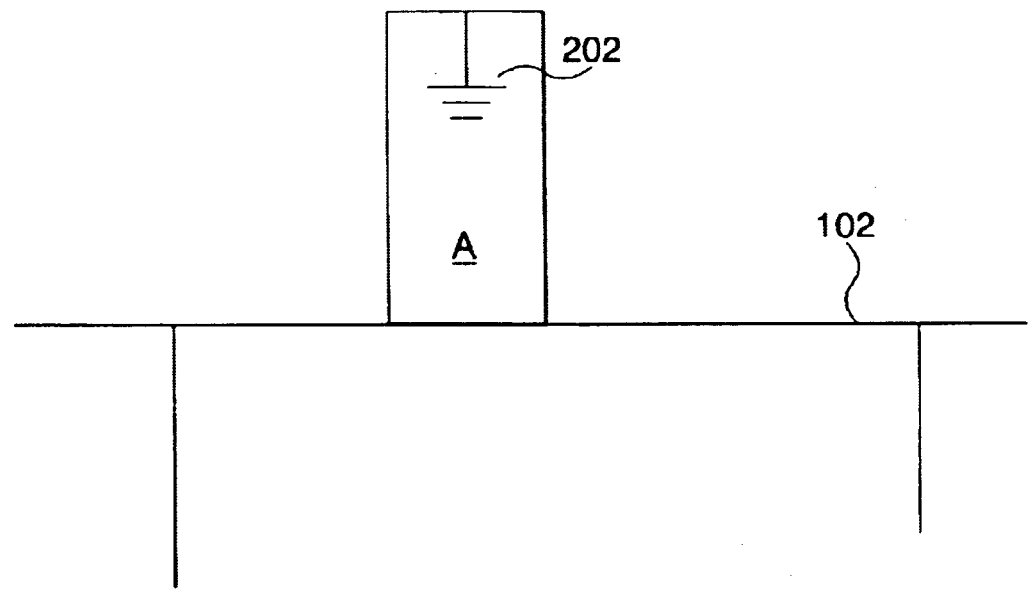

So far, the only notion used to explain the stability of a scene is surface-to-surface contact. However, this is insufficient. In FIG. 1, the table top 102 supports polygons A and F and prevents them from falling. But what supports the table top 102 and prevents it from falling? To account for the stability of the table top, one needs to ascribe to it the distinguished property of being grounded, i.e. of being inherently supported and not requiring any further source of support. This property is indicated by the ground symbol 202 attached to the table top 102 in FIG. 2(a). In doing so, one analyzes a scene under an interpretation. Some aspects of a scene are visible. For example, the positions, orientations, shapes, and sizes of the polygons in the scene. Other aspects of a scene are invisible and subject to interpretation. For example, which polygons are grounded. This leads to the possibility of multiple interpretations of a scene, some of which are stable and some of which are not. For example, if the table top 102 is grounded and polygon A is not, as in FIG. 2(a), the scene is stable, while if polygon A is grounded while the table top 102 is not, as in FIG. 2(b), the scene is not stable.

Figure 3A:
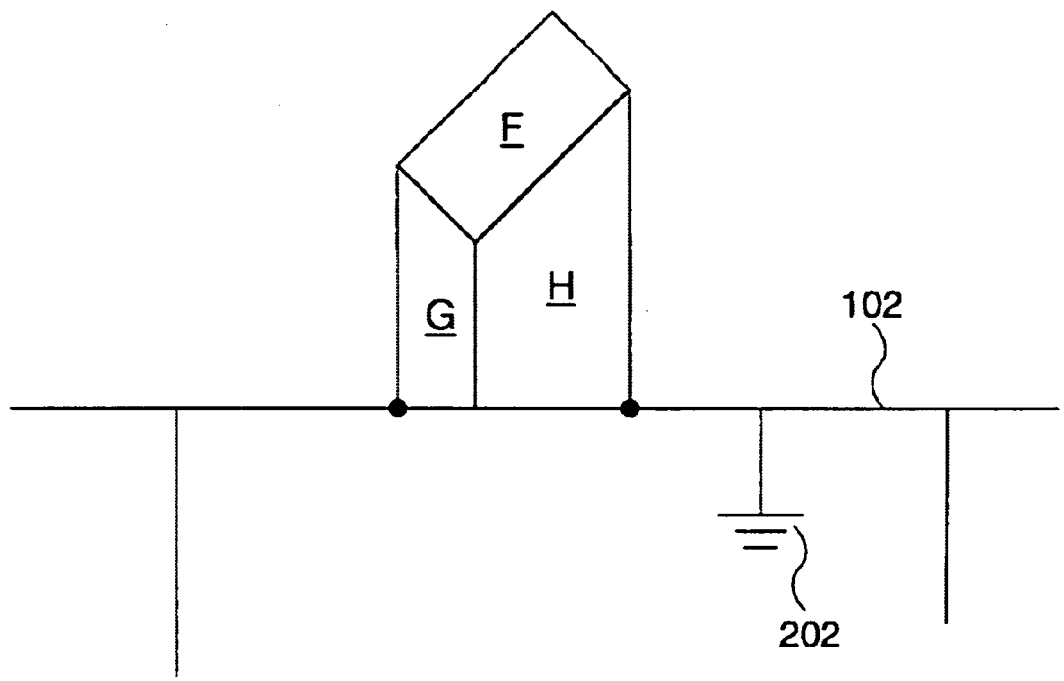
FIG. 3(a) is a schematic diagram representing a block F resting on two blocks G and H that are rigidly attached to a grounded table top.
Figure 3B:
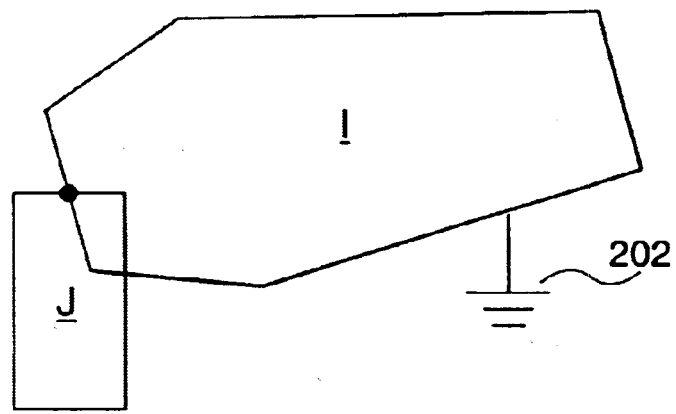
FIG. 3(b) is a schematic diagram representing an attachment relation between a hand I and a block J.

In actuality, polygon F in FIG. 1 is also unstable. Because, in the absence of friction, the two polygons G and H that support polygon F can slide sideways along axis X—X. To explain the stability of polygon F, one can hypothesize the polygons G and H are attached to the table top 102, as shown in FIG. 3(a). Likewise, suppose that FIG. 3(b) depicts a hand I grasping a block J. To explain the stability of polygon J, one must hypothesize that polygon J is attached to polygon I, even if polygon I is grounded. These attachment relations are indicated by small solid circles in FIGS. 3(a) and 3(b).

Figure 4A:
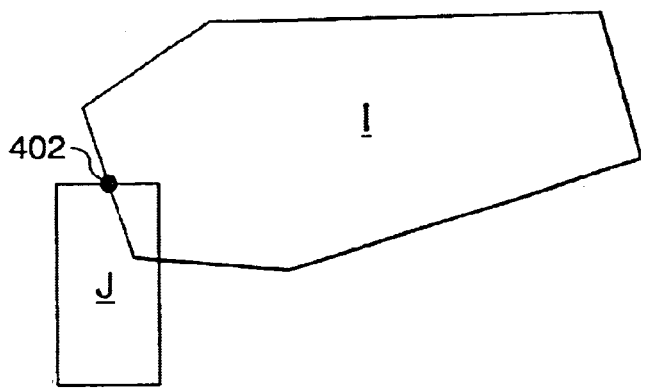
FIGS. 4(a), 4(b) are schematic diagrams representing a rigid joint, a revolute joint, and a prismatic joint, respectively.
Figure 4B:
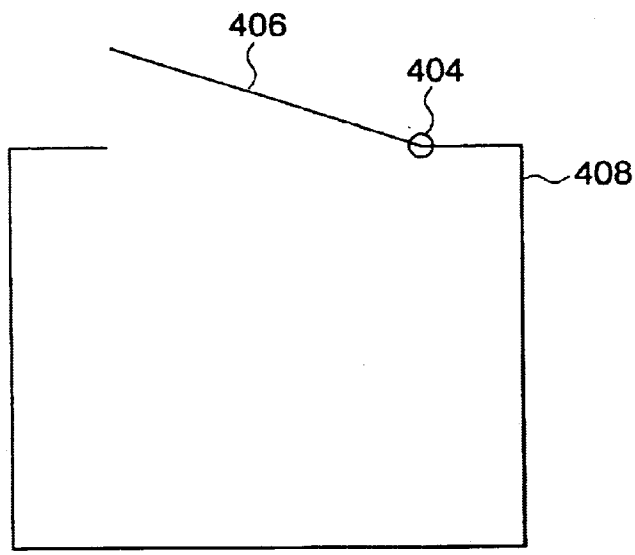
Figure 4C:
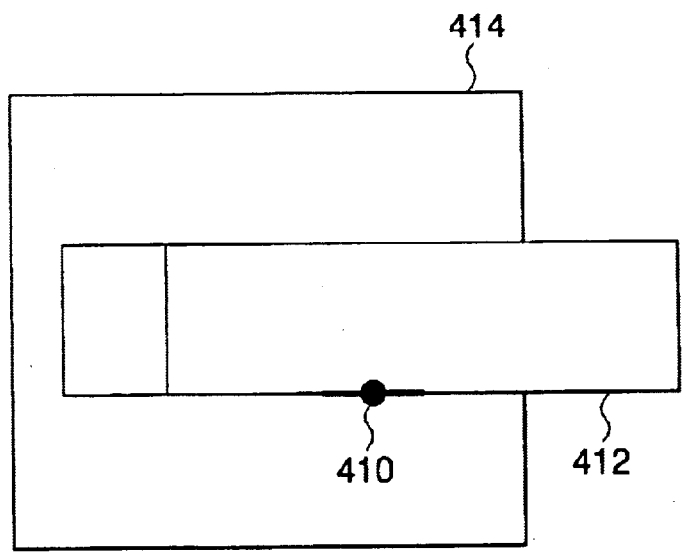

There are a wide variety of different kinds of attachment relations. Each kind of attachment relation imposes different constraints on the relative motion of the attached polygons. In this patent disclosure, three kinds of attachment relations are considered, namely rigid joints, revolute joints, and prismatic joints. Rigid joints, indicated by small solid circles, constrain the relative rotation and translation of the attached objects. FIG. 4(a) depicts a rigid joint 402, hand I grasping block J. Revolute joints 404, indicated by small unfilled circles, constrain the relative translation of the attached polygons but allow one polygon to rotate relative to the other about the revolute joint 404. FIG. 4(b) depicts a revolute joint 404 between a washing machine cover 406 and its base 408. Prismatic joints 410, indicated by small solid circles with small thick lines along one of the joined edges, constrain the relative rotation of the two attached polygons but allow one polygon to translate relative to the other along the direction of the small thick line. FIG. 4(c) depicts a prismatic joint 410 between a drawer 412 and its cabinet 414.

Figure 5A:
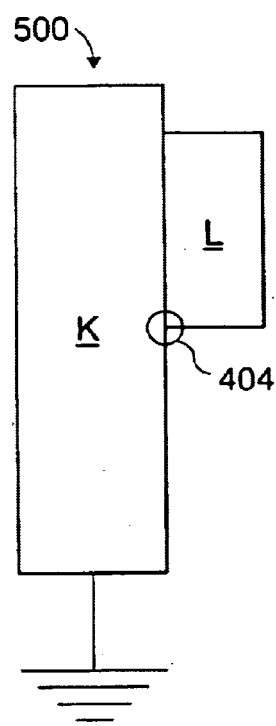
FIGS. 5(a), 5(b), 5(c), and 5(d) are schematic diagrams which define differing attachment relations and therefore different stability interpretations.
Figure 5B:
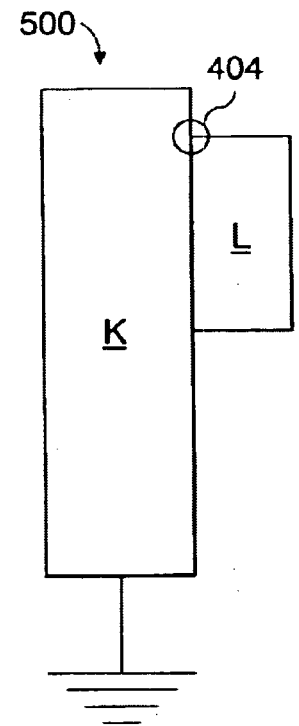
Figure 5C:
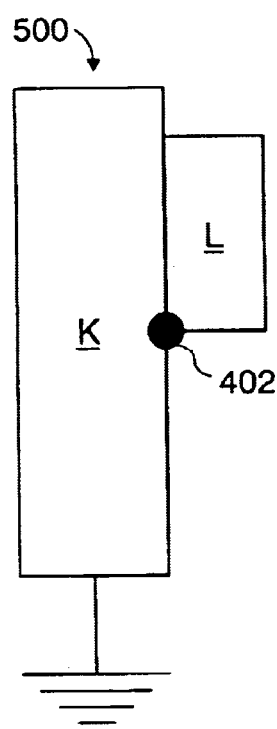
Figure 5D:
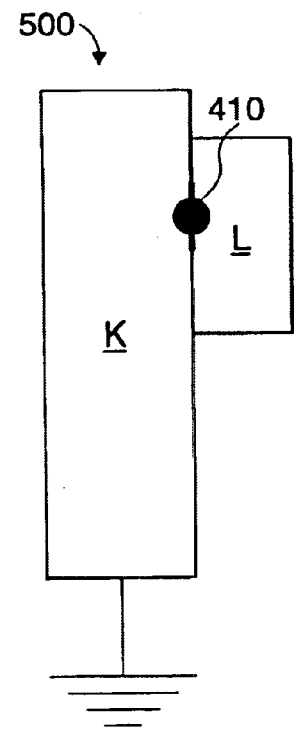

Attachment relations, like the grounded property, are subject to interpretation. And just as is the case for the grounded property, different interpretations of the same scene that specify different attachment relations will lead to different stability judgments. FIGS. 5(a)–5(d) show four different interpretations of the same scene 500. The interpretations of scene 500 shown in FIGS. 5(b) and 5(c) are stable, because polygons K and L cannot move under the force of gravity, while the interpretations in FIGS. 5(a) and 5(d) are not stable, because polygon L is free to rotate clockwise in FIG. 5(a) about revolute joint 404 and polygon L is free to translate vertically in FIG. 5(d) along prismatic joint 410.

Figure 6A:
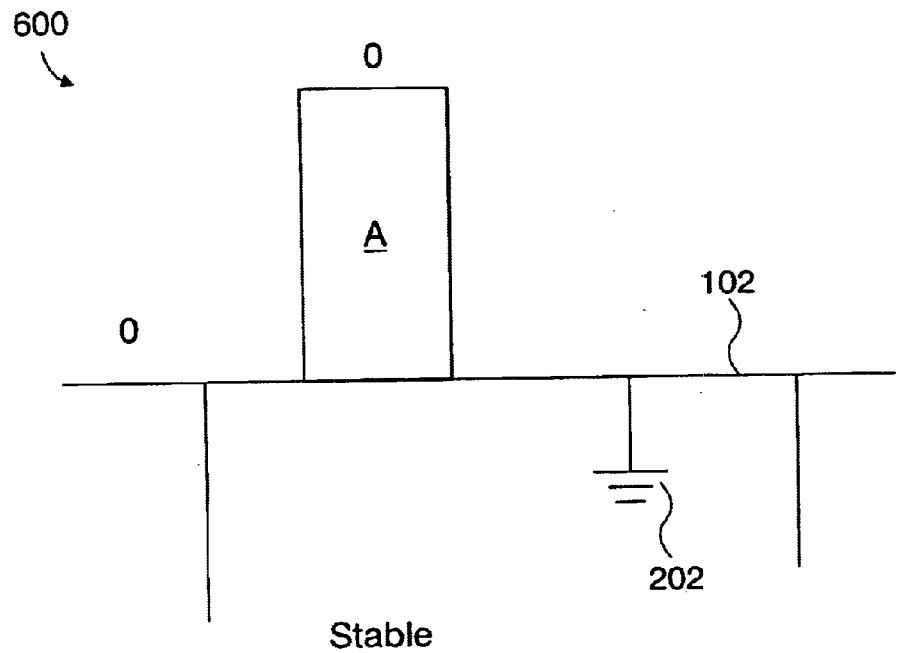
FIGS. 6(a) and 6(b) are schematic diagrams depicting different depth interpretations effecting differing stability judgments on similar scenes.
Figure 6B:
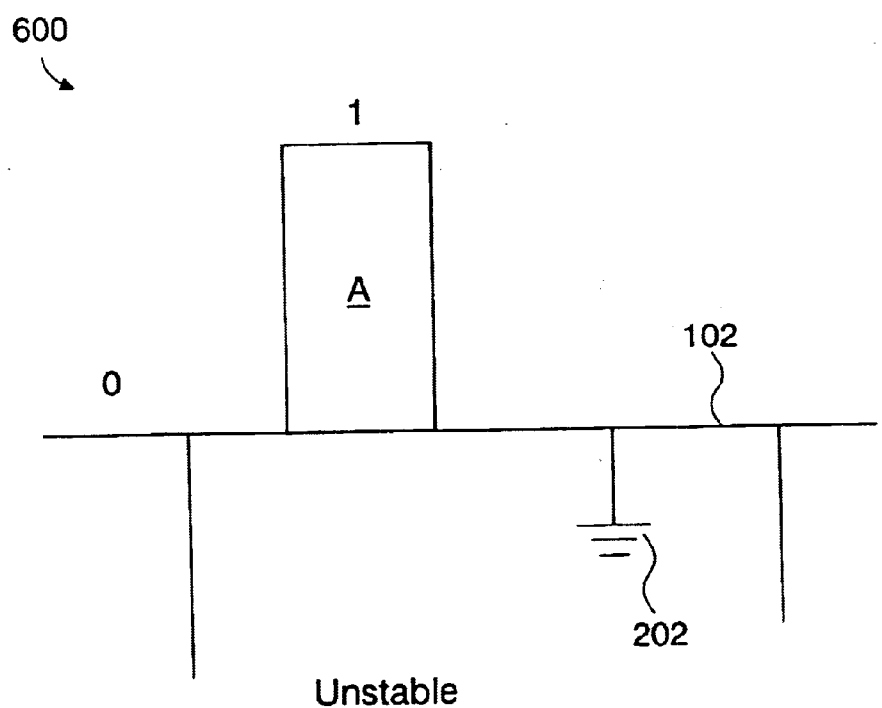

The world is three dimensional while images are 2D projections of the 3D world. When you see a scene 600, like that in FIGS. 6(a) and 6(b), it is unclear whether polygon A is in front of, on, or behind the table 102. Like the grounded property and attachment relations, different interpretations of the relative depth of polygons will lead to different stability judgments. If polygon A is on the table 102, as shown in FIG. 6(a), then the scene 600 is stable. If polygon A is in front of or behind the table 102, as shown in FIG. 6(b), then the scene 600 is not stable. For purposes of this disclosure, it is assumed that each polygon lies on a plane that is parallel to the image plane. Any two polygons are said to either be on the same layer or on different layers. Two polygons are depicted as being on the same layer by giving them the same layer index (FIG. 6(a) shows both polygon A and the table 102 as having the same layer index 0). Two polygons are depicted as being on different layers by giving them different layer indices (FIG. 6(b) shows polygon A at layer index 1 and the table 102 at layer index 0). Two polygons can be in contact only if they are on the same layer. Thus one polygon can support another polygon by contact only if they are on the same layer.

The methods of the present invention use an algorithm STABLE (P, I) for determining the stability of a polygonal scene under an interpretation. The input to this method consists of a scene having a set P of polygons and an interpretation I. The output is a designation of Stable or Unstable indicating whether or not the scene is stable.

The primary application that is currently being considered for the methods of the present invention is visual event perception. In this application, a video camera is connected to a computer system and the computer system recognizes simple actions performed by a human in front of the video camera. For example, the human can pick up or put down blocks. The counter system takes the video input, digitizes it, segments each frame of the video input into the participant objects and tracks those objects over time. A scene is generated for each frame by placing polygons around the human's hand and other objects in the scene. The computer then generates all possible interpretations for each scene, checks the stability of each interpretation for each scene and constructs a preferred set of stable interpretations for each scene. With a sequence of such preferred stable interpretations, a pick up event can be recognized by detecting a state change where the object being picked up starts out being supported by being in contact with the table and is subsequently supported by being attached to the hand. Likewise, a put down event can be recognized by detecting the reverse state change. The approaches to visual event classification of the prior art use motion profiles rather than changes in support, contact, and attachment relations.

A prototype implementation has been constructed for the methods of the present invention. FIGS. 7(a)–7(d) show the results of processing four short movies with this implementation, the movies illustrated in FIGS. 7(a)–7(d) are referred to generally by reference numerals 700, 720, 740, and 760, respectively. Each Figure shows a subset of the frames from a single movie. From FIGS. 7(a) to 7(d), the movies 700, 720, 740, and 760 have 29, 34, 16, and 16 frames, respectively, of which six frames are shown. Each movies was processed by a segmentation procedure to place convex polygons around the colored and moving objects in each frame. A tracking procedure computed the correspondence between the polygons in each frame and those in the adjacent frames. Such segmentation and tracking procedures are well known in the art and can be automatically or manually carried out by software. A model reconstruction procedure was used to construct a preferred stable interpretation of each frame. This model reconstruction procedure used the stability determination methods of the present invention. Each frame is shown with the results of segmentation and model reconstruction superimposed on the original video image.

Figure 7A:
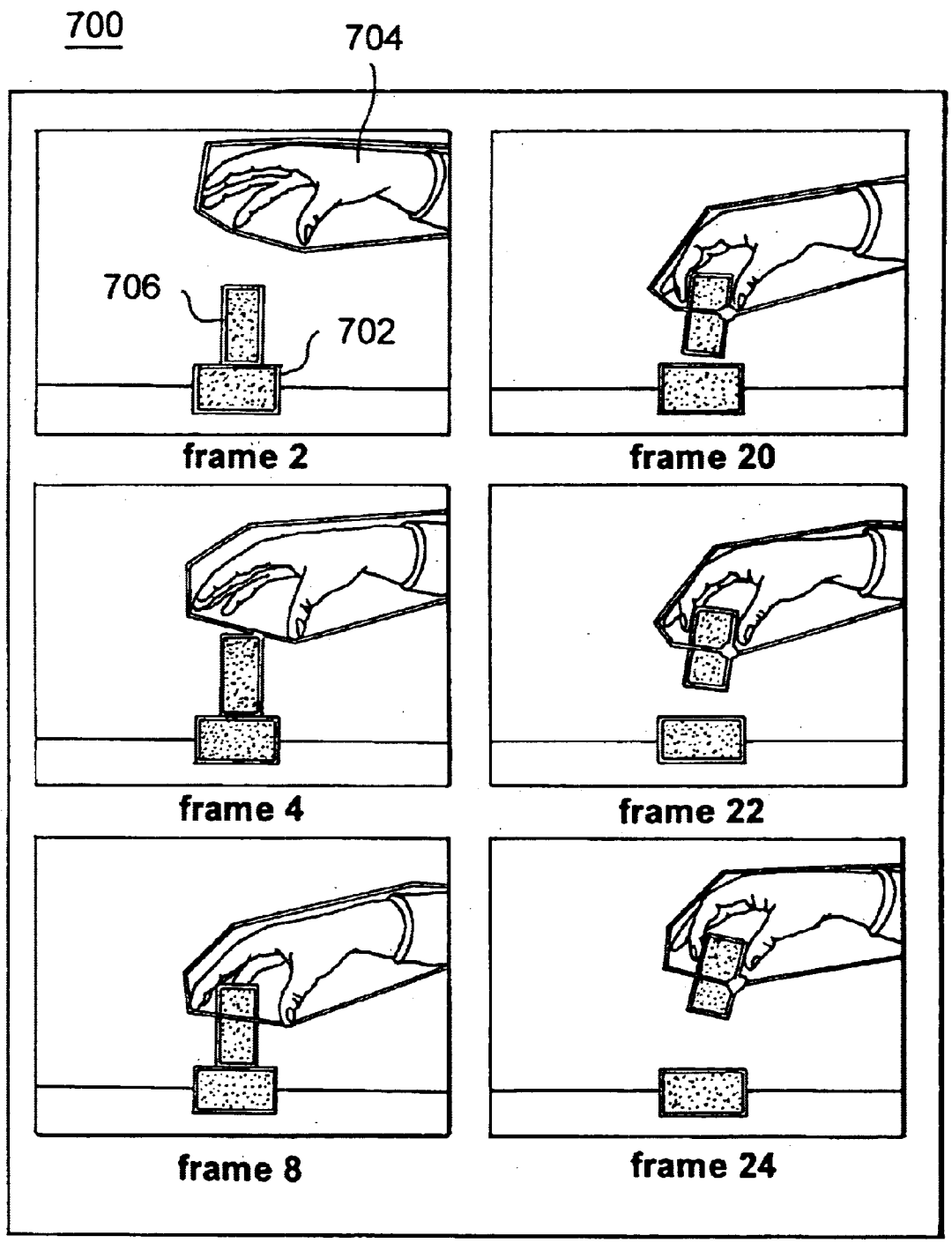
FIGS. 7(a), 7(b), 7(c), and 7(d) are sets of sequential frames of four movies which were analyzed by a machine vision system utilizing the stability determination method of the present invention.
Figure 7B:
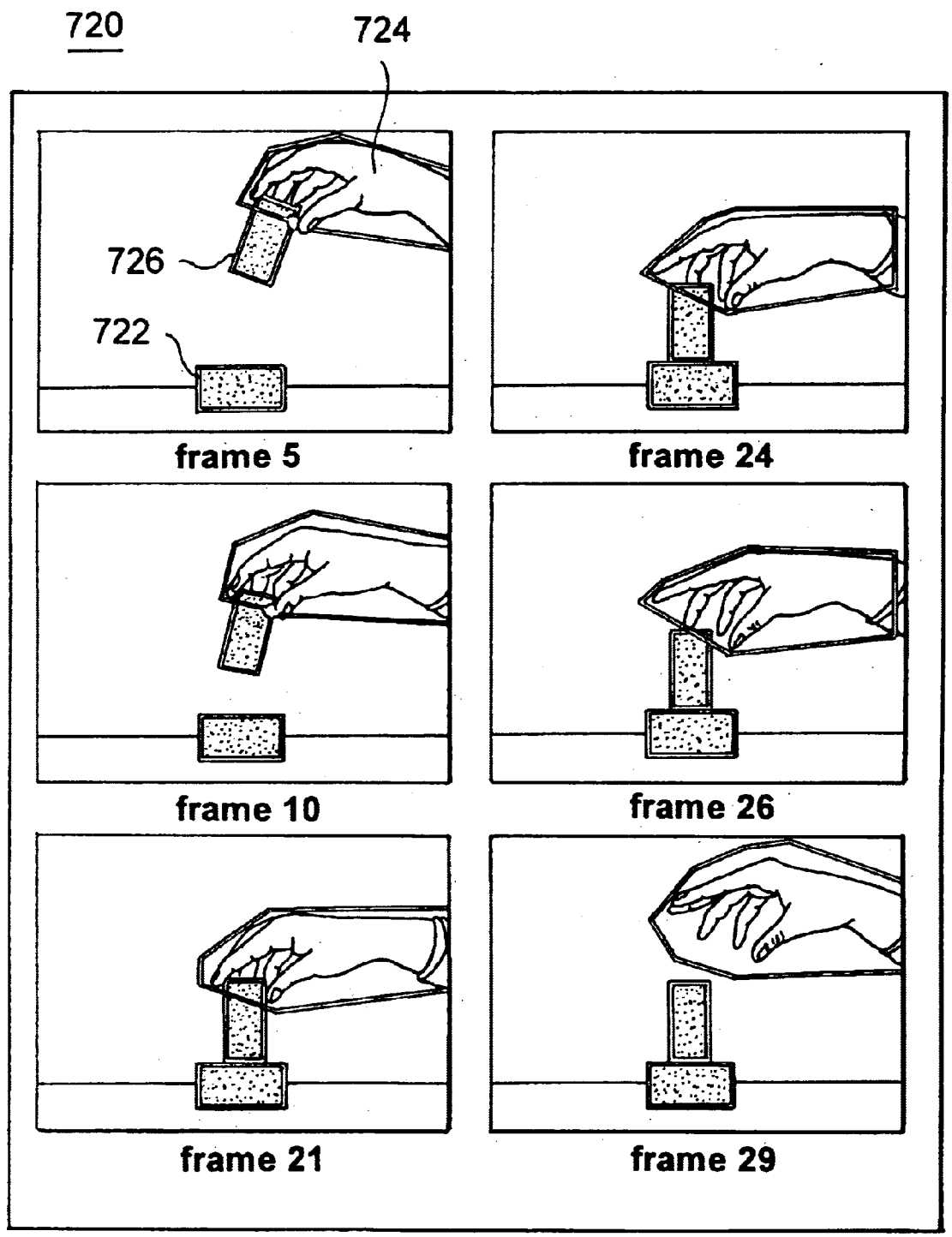
Figure 7C:
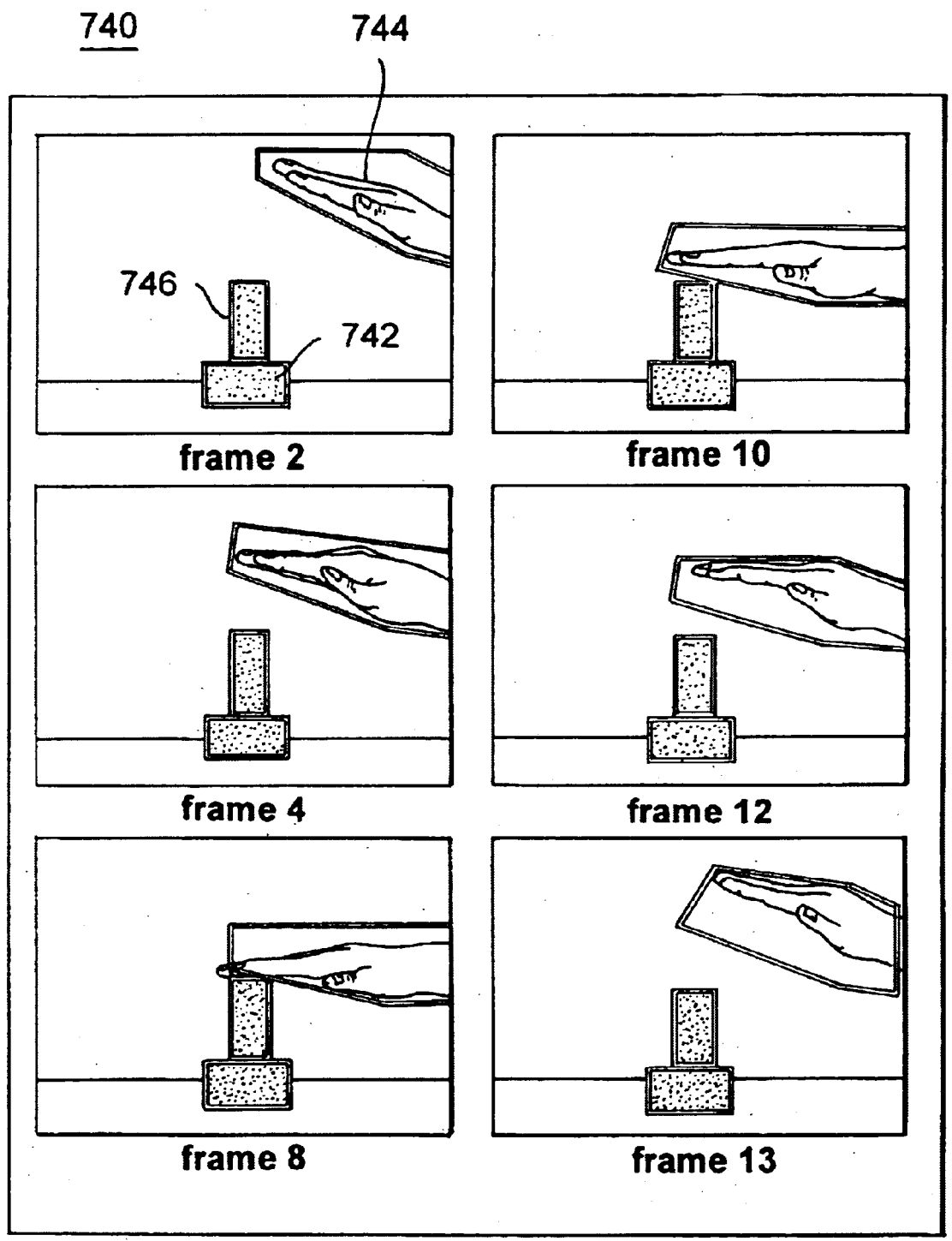
Figure 7D:
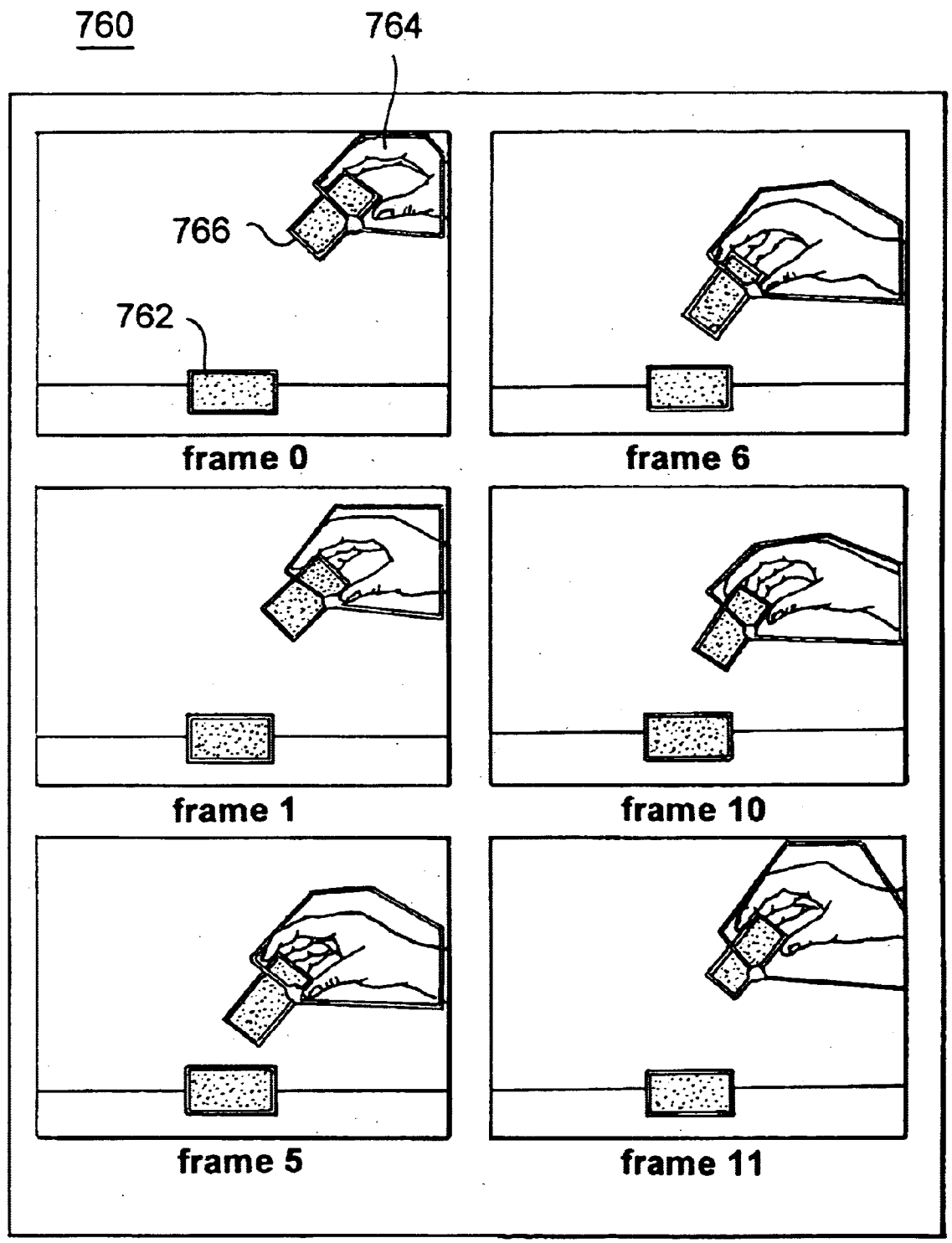

Referring to movie 700 illustrated in FIG. 7(a), notice that the method of the present invention determines that the lower block 702 and the hand 704 are grounded for the entire movie 700, that the upper block 706 is supported by being on the same layer as the lower block 702 for frames 2, 4, and 8, and that the upper block 706 is supported by being rigidly attached to the hand 704 for frames 20, 22, and 24. Referring to movie 720 illustrated in FIG. 7(b), notice that the method of the present invention determines that the lower block 722 and the hand 724 are grounded for the entire movie 720, that the upper block 726 is supported by being rigidly attached to the hand 724 for frames 5 and 10, and that the upper block 726 is supported by being on the same layer as the lower block 722 for frames 21, 24, 26, and 29. Referring to movie 740 illustrated in FIG. 7(c), notice that the method of the present invention determines that the lower block 742 and the hand 744 are grounded for the entire movie 740 and that the upper block 746 is supported for the entire movie 740 by being on the same layer as the lower block 742. Referring to movie 760 illustrated in FIG. 7(d), notice that the method of the present invention determines that the lower block 762 and the hand 764 are grounded for the entire movie 760 and that the upper block 766 is supported for the entire movie 760 by being rigidly attached to the hand 764.

The prototype implementation was given the following lexicon when processing the movies 700, 720, 740, and 760 of FIGS. 7(a)–7(d):

$$PICKUP(x, y) \triangleq \begin{bmatrix} \neg \text{SUPPORTED}(x) \land \text{SUPPORTED}(y) \land \\ (\neg \text{ATTACHED}(x, y); \text{ATTACHED}(x, y)) \end{bmatrix}$$

$$PUTDOWN(x, y) \triangleq \begin{bmatrix} \neg \text{SUPPORTED}(x) \land \text{SUPPORTED}(y) \land \\ (\text{ATTACHED}(x, y); \neg \text{ATTACHED}(x, y)) \end{bmatrix}$$

Essentially, these define pick up and put down as events where the agent (hand) is not supported throughout the event, the patient (block) is supported throughout the event, and the agent grasps or releases the patient, respectively. The methods of the present invention correctly recognize the movie 700 in FIG. 7(a) as depicting a pick up event and the movie 720 in FIG. 7(b) as depicting a put down event. More importantly, the methods of the present invention correctly recognize that the remaining two movies 740, 760 of FIGS. 7(c) and 7(d) do not depict any of the defined event types.

Note that systems of the prior art that classify events based on motion profiles will often mistakenly classify these last two movies 740, 760 as either pick up or put down events because they have similar motion profiles.

An algorithm used in the methods of the present invention to make a determination of stability for a given score will now be described. The algorithm, named STABLE (P, I), that determines whether a set P of polygons is stable under an interpretation I is determined by reducing the problem to determining whether a set L of line segments is stable under an interpretation I. Thus, the algorithm STABLE (P, I) is defined from STABLE (L, I) simply by considering each polygon to be a set of rigidly joined line segments on the same layer.

The line segments in a scene have fixed positions and orientations. The coordinates of a point p are denoted as x(p) and y(p). The endpoints of a line segment l are denoted as p(l) and q(l). The length of a line segment l is denoted as $\|l\|$. The position of a line segment is denoted as the position of its midpoint c. The orientation $\theta(l)$ of a line segment l is denoted as the angle of the vector from p(l) to q(l). The quantities p(l), q(l), $\|l\|$, c(l), and $\theta(l)$ are all fixed in a given scene. And p(l) and q(l) are related to $\|l\|$, c(l), and $\theta(l)$ as follows:

$$c(l) = \frac{p(l) + q(l)}{2}$$

$$\|l\| = \sqrt{(q(l) - p(l)) \cdot (q(l) - p(l))}$$

$$\theta(l) = \tan^{-1} \frac{y(q(l)) - y(p(l))}{x(q(l)) - x(p(l))}$$

$$x(p(l)) = x(c(l)) - \frac{1}{2}\|l\|\cos\theta(l)$$

$$y(p(l)) = y(c(l)) - \frac{1}{2}\|l\|\sin\theta(l)$$

$$x(q(l)) = x(c(l)) + \frac{1}{2}\|l\|\cos\theta(l)$$

$$y(q(l)) = y(c(l)) + \frac{1}{2}\|l\|\sin\theta(l)$$

An interpretation I is a quintuple $<g, \leftrightarrows_i, \leftrightarrows_j, \leftrightarrows_\theta, \bowtie>$, g is a property of line segments while $\leftrightarrows_i, \leftrightarrows_j, \leftrightarrows_\theta$, and $\bowtie$'s are relations between pairs of line segments. The assertion g(l) indicated that line segment l is grounded. The assertion $l_i \leftrightarrows_i l_j$ indicates that the position of the intersection of $l_i$ and $l_j$ is fixed along $l_i$. The assertion $l_i \leftrightarrows_j l_j$ indicates that the position of the intersection of $l_i$ and $l_j$ is fixed along $l_j$. The assertion $l_i \leftrightarrows_\theta l_j$ indicates that the angle between $l_i$ and $l_j$ is fixed. Collectively, $\leftrightarrows_i, \leftrightarrows_j$, and $\leftrightarrows_\theta$ describe the attachment relations.

IF $l_i \leftrightarrows_i l_j \land l_i \leftrightarrows_j l_j \land l_i \leftrightarrows_\theta l_j$, then $l_i$ and $l_j$ are joined by a rigid joint 402. If $l_i \leftrightarrows_i l_j \land l_i \leftrightarrows_j l_j \land l_i$ not $\leftrightarrows_\theta l_j$, then $l_i$ and $l_j$ are joined by a revolute joint 404. If $l_i$ not $\leftrightarrows_i l_j \land l_i \leftrightarrows_j l_j \land l_i \leftrightarrows_\theta l_j$, then $l_i$ and $l_j$ are joined by a prismatic joint 410 that allows $l_j$ to slide along $l_i$. IF $l_i \leftrightarrows_i l_j \land l_i$ not $\leftrightarrows_j l_j \land l_i \leftrightarrows_\theta l_j$, then $l_i$ and $l_j$ are joined by a prismatic joint 410 that allows $l_i$ to slide along $l_j$. If $l_i$ not $\leftrightarrows_i l_j \land l_i$ not $\leftrightarrows_j l_j \land l_i$ not $\leftrightarrows_\theta l_j$, then $l_i$ and $l_j$ are not joined. Finally, the assertion $l_i \bowtie l_j$ indicates that $l_i$ and $l_j$ are on the same layer.

An interpretation is admissible if the following conditions hold:

For all $l_i$ and $l_j$, if $l_i \leftrightarrows_i l_j, l_i \leftrightarrows_j l_j$, or $l_i \bowtie l_j$, then $l_i$ intersects $l_j$.

For all $l_i$ and $l_j$, $l_i \leftrightarrows_i l_j$ if $l_j \leftrightarrows_j l_i$.

$\leftrightarrows_\theta$ is symmetric.

For all $l_i$ and $l_j$, if $l_i \bowtie l_j$, then $l_i$ and $l_j$ do not overlap. Two line segments overlap if they intersect in a non-collinear fashion and the point of intersection is not an endpoint of either line segment.

$\bowtie$ is symmetric and transitive. Only admissible interpretations are considered.

Let us postulate an unknown instantaneous motion for each line segment l in a scene. This can be represented by associating a linear and angular velocity with each line segment l. Such velocities are denoted with the variables $\dot{c}(l)$ and $\dot{\theta}(l)$. It is assumed that there is no motion in depth so the $\bowtie$ relation does not change. If the scene contains n line segments, then there will be 3n scalar variables, because $\dot{c}$ has x and y components. Assuming that the line segments are rigid, i.e. that instantaneous motion does not lead to a change in their length, one can relate $\dot{p}(l)$ and $\dot{q}(l)$, the instantaneous velocities of the endpoints, to $\dot{c}(l)$ and $\dot{\theta}(l)$, using the chain rule as follows:

$$\dot{p}(l) = \frac{\partial p(l)}{\partial x(c(l))} x(\dot{c}(l)) + \frac{\partial p(l)}{\partial y(c(l))} y(\dot{c}(l)) + \frac{\partial p(l)}{\partial \theta(l)} \dot{\theta}(l)$$

$$\dot{q}(l) = \frac{\partial q(l)}{\partial x(c(l))} x(\dot{c}(l)) + \frac{\partial q(l)}{\partial y(c(l))} y(\dot{c}(l)) + \frac{\partial q(l)}{\partial \theta(l)} \dot{\theta}(l)$$

where each of $\dot{p}(l)$ and $\dot{q}(l)$ are linear in $\dot{c}(l)$ and $\dot{\theta}(l)$.

Each of the components of an admissible interpretation of a scene can be viewed as imposing constraints on the instantaneous motions of the line segments in that scene. The simplest case is the g property. If g(l), then $$\dot{c}(l)=0 \qquad (1)$$

and $$\dot{\theta}(l)=0 \qquad (2)$$

Note that equations (1) and (2) are linear in $\dot{c}(l)$ and $\dot{\theta}(l)$.

Let us now consider the $l_i \leftrightarrows_i l_j$ and $l_i \leftrightarrows_j l_j$ relations and the constraint that they impose on the motions of $l_i$ and $l_j$. First, the intersection of the $l_i$ and $l_j$ is denoted as $I(l_i, l_j)$. If we let $$A = \begin{pmatrix} y(p(l_i)) - y(q(l_i)) & x(q(l_i)) - x(p(l_i)) \\ y(p(l_j)) - y(q(l_j)) & x(q(l_j)) - x(p(l_j)) \end{pmatrix}$$

$$b = \begin{pmatrix} y(p(l_i))(x(q(l_i)) - x(p(l_i))) + x(p(l_i))(y(p(l_i)) - y(q(l_i))) \\ y(p(l_j))(x(q(l_j)) - x(p(l_j))) + x(p(l_j))(y(p(l_j)) - y(q(l_j))) \end{pmatrix}$$

then $I(l_i, l_j) = A^{-1} b$.

Next, let us denote by $\rho(p,l)$, where p is a point on l, the fraction of the distance where p lies between p(l) and q(l).

$$\rho(p, l) = \sqrt{\frac{(p - p(l)) \cdot (p - p(l))}{\|l\|}}$$

Recall that $I(l_i, l_j)$ is the intersection of $l_i$ and $l_j$. Thus $\rho(I(l_i, i_j), l_i)$ is the fraction of the distance of that intersection point along $l_i$. Next, let us compute $\dot{\rho}(I(l_i, l_j), l_i)$, which is the change in $\rho(I(l_i, l_j), l_i)$. Let $\alpha$ be the vector containing the elements $x(p(l_i))$, $y(p(l_i))$, $x(q(l_i))$, $y(q(l_i))$, $x(p(l_j))$, $y(p(l_j))$, $x(q(l_j))$, and $y(q(l_j))$, let $\beta$ be the vector containing the elements $x(c(l_i))$, $y(c(l_i))$, $\theta(l_i)$, $x(c(l_j))$, $y(c(l_j))$, and $\theta(l_j)$, let $\gamma$ be the vector where $$Y_k = \frac{\partial \rho(I(l_i, l_j), l_i)}{\partial \alpha_k},$$

and let D be the matrix where $D_{kl} = a\alpha_k/a\beta_l$. $\dot{\rho}(I(l_i, l_j), l_i)$ can be computed by the chain rule as follows:

$$\dot{\rho}(I(l_i,l_j),l_i) = \gamma^T D \dot{\leftrightarrows}$$

Note that $\dot{\rho}(I(l_i, l_j), l_i)$ is linear in $\dot{c}(l_i)$, $\dot{\theta}(l_i)$, $\dot{c}(l_j)$, and $\dot{\theta}(l_j)$ because all of the partial derivatives are constant.

Similarly, $\rho(I(l_i, l_j), l_j)$ is the fraction of the distance of the intersection of $l_i$ and $l_j$ along $l_j$. Next, let us compute $\dot{\rho}(I(l_i, l_j), l_j)$, which is the change in $\rho(I(l_i, l_j), l_j)$. Let $\alpha$ be the vector containing the elements $x(p(l_i))$, $y(p(l_i))$, $x(q(l_i))$, $y(q(l_i))$, $x(p(l_j))$, $y(p(l_j))$, $x(q(l_j))$, and $y(q(l_j))$, let $\beta$ be the vector containing the elements $x(c(l_i))$, $y(c(l_i))$, $\theta(l_i)$, $x(c(l_j))$, $y(c(l_j))$, and $\theta(l_j)$, let $\gamma$ be the vector where $$Y_k = \frac{\partial \rho(I(l_i, l_j), l_j)}{\partial \alpha_k}$$

and let D be the matrix where $D_{kl} = a\alpha_k/a\beta_l$. $\dot{\rho}(I(l_i, l_j), l_j)$ can be computed by the chain rule as follows:

$$\dot{\rho}(I(l_i,l_j),l_j) = \gamma^T D \dot{\beta}$$

Note the $\dot{\rho}(I(l_i, l_j), l_j)$ is linear in $\dot{c}(l_i)$, $\dot{\theta}(l_i)$, $\dot{c}(l_j)$, and $\dot{\theta}(l_j)$ because all of the partial derivatives are constant.

The $\leftrightarrows_i$ constraint can then be formulated as follows: if $l_i \leftrightarrows_i l_j$, then $$\dot{\rho}(I(l_i, l_j), l_i) = 0 \qquad (3)$$

And the $\leftrightarrows_j$ constraint can then be formulated as follows: if $l_i \leftrightarrows_j l_j$, then $$\dot{\rho}(I(l_i, l_j), l_j) = 0 \qquad (4)$$

Again, note that equations (3) and (4) are linear in $\dot{c}(l_i)$, $\dot{\theta}(l_i)$, and $\dot{\theta}(l_j)$.

Let us now consider the $l_i \leftrightarrows_\theta l_j$ relation and the constraint that it imposes on the motions of $l_i$ and $l_j$. If $l_i \leftrightarrows_\theta l_j$, then $$\dot{\theta}(l_i) = \dot{\theta}(l_j) \qquad (5)$$

Again, note that equation (5) is linear in $\dot{\theta}(l_i)$ and $\dot{\theta}(l_j)$.

The same-layer relation $l_i \bowtie l_j$ imposes the constraint that the motion of $l_i$ and $l_j$ must not lead to an instantaneous penetration of one by the other. An instantaneous penetration can occur only when the endpoint of one line segment touches the other line segment. Without loss of generality, let us assume that $p(l_i)$ touches $l_j$. Let $\bar{p}$ denote a vector of the same magnitude as p rotated counterclockwise 90°.

$$\overline{(x,y)} = (-y,x)$$

Let $\sigma$ be a vector that is normal to $l_j$, in the direction towards $l_i$.

$$\sigma = -\overline{[q(l_j)-p(l_j)} \cdot (q(l_i)-p(l_i)))\overline{q(l_j)-p(l_j)}$$

If $0 \leq \rho \leq 1$, let us denote by $l(\rho)$ the point that is the fraction $\rho$ of the distance between p(l) and q(l).

$$l(\rho) = p(l) + \rho(q(l) - p(l))$$

And let us denote by $\dot{l}(\rho)$ the velocity of the point that is the fraction $\rho$ of the distance between p(l) and q(l) as l moves. Let $\alpha$ be the vector containing the elements $x(p(l))$, $y(p(l))$, $x(q(l))$, and $y(q(l))$, let $\beta$ be the vector containing the elements $x(c(l))$, $y(c(l))$, and $\theta(l)$, let $\gamma$ be the vector where $\gamma_k = al(\rho)/a\alpha_k$, and let D be the matrix where $D_{kl} = a\alpha_k/a\beta_l$. Again, by the chain rule:

$$\dot{l}(\rho) = \gamma^T D \dot{\beta}$$

Again, not that $\dot{l}(\rho)$ is linear in $\dot{c}(l)$ and $\dot{\theta}(l)$ because all of the partial derivatives are constant.

An instantaneous penetration can occur only when the velocity of $p(l_i)$ in the direction of $\sigma$ is less than the velocity of the point of contact in the same direction. The velocity of $p(l_i)$ is $\dot{p}(l_i)$ and the velocity of the point of contact is $\dot{l}_j(\rho(p(l_i, l_j)))$. Thus if $l_i \bowtie l_j$ and $p(l_i)$ touches $l_j$, then $$\dot{p}(l_i) \cdot \sigma \leq \dot{l}_j(\rho(p(l_i),l_j)) \cdot \sigma \qquad (6)$$

Again, note that inequality (6) is linear in $\dot{c}(l_i)$, $\dot{\theta}(l_i)$, $\dot{c}(l_j)$, and $\dot{\theta}(l_j)$.

We now wish to determine the stability of a scene under an admissible interpretation. A scene is unstable if there is an assignment of linear and angular velocities to the line segments in the scene that satisfies the above constraints and decreases the potential energy of the scene. The potential energy of a scene is the sum of potential energies of the line segments in that scene. The potential energy of a line segment l is proportional to its mass times $y(c(l))$. We can take the mass of a line segment to be proportional to its length. So the potential energy E can be taken as $\Sigma_{l \in L} \|l\| y(c(l))$.

The potential energy can decrease if $\dot{\epsilon} < 0$. By scale invariance, if E can be less then zero, then it can be equal to any value less than zero, in particular $-1$. Thus a scene is unstable under an admissible interpretation is the constraint $$\dot{E} = -1 \qquad (7)$$

is consistent with the above constraints. Note that E is linear in all of the $\dot{c}(l)$ values. Thus the stability of a scene under an admissible interpretation can be determined by a reduction to linear programming.

This leads to the following algorithm STABLE (L,I) for determining whether a set L of line segments is stable under an interpretation I where $I = <g, \leftrightarrows_i, \leftrightarrows_j, \leftrightarrows_\theta, \bowtie>$.

Figure 8:
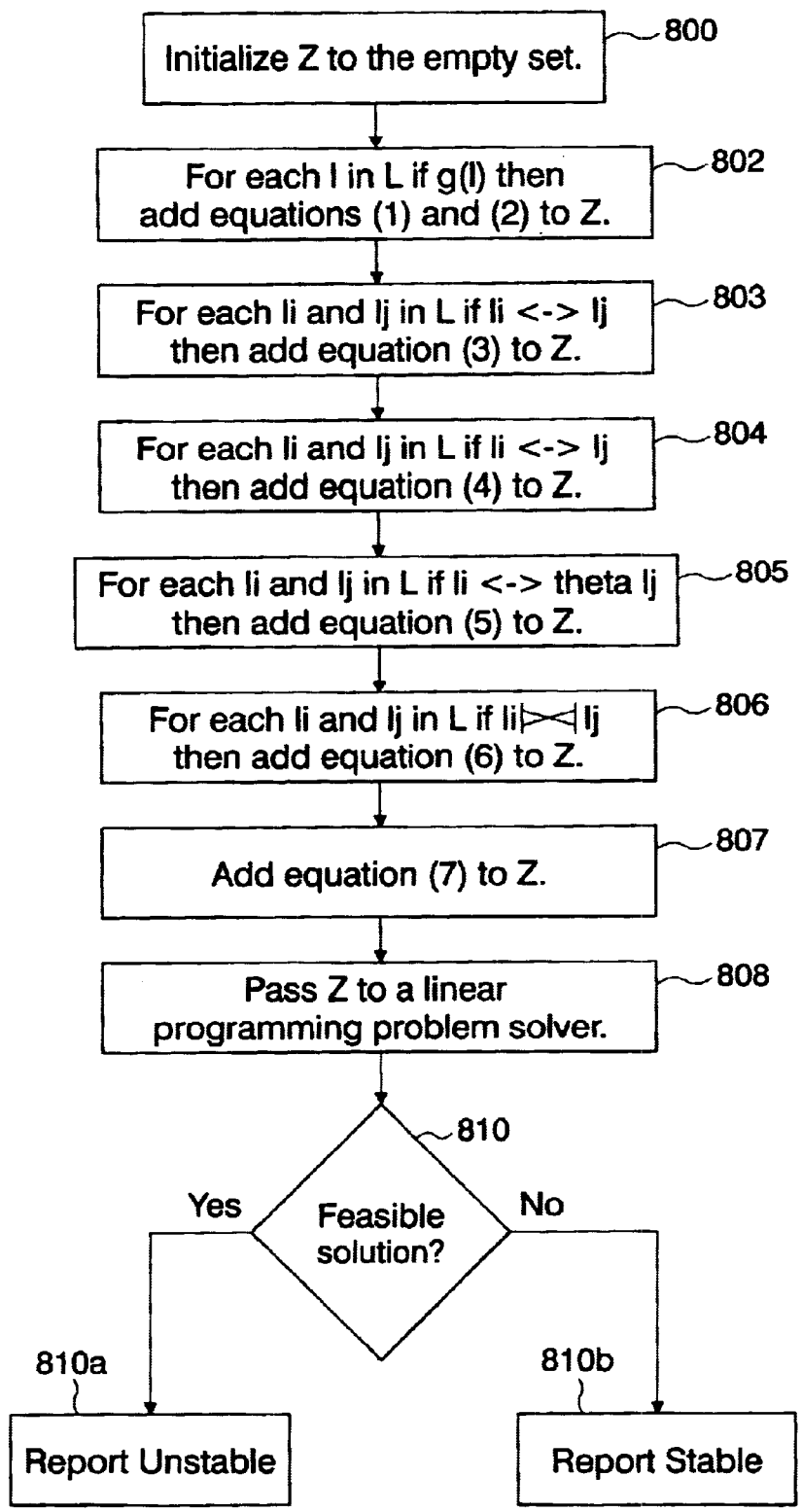
FIG. 8 is a schematic flow diagram depicting one embodiment of the stability determination method of the present invention.

In summary, the method of the present invention for determining the stability of a scene can be summarized by reference to the flowchart of FIG. 8:

At step 800: Initialize the set Z of constraints to the empty set;

At step 802: For each element l contained in L, if g(l), instantiate equations $\dot{c}(l)=0$ and $\dot{\theta}(l)=0$, and then add them to Z;

At step 803: For each $l_i$, $l_j \in L$, if $l_i \leftrightarrows_i l_j$, instantiate the equation $\dot{\rho}(I(l_i, l_j), l_j) = 0$ between $l_i$ and $l_j$ and add it to Z;

At step 804: For each $l_i$, $l_j \in L$, if $l_i \leftrightarrows_j l_j$, instantiate the equation $\dot{\rho}(I(l_i, l_j), l_j) = 0$ between $l_i$ and $l_j$ and add it to Z;

At step 805: For each $l_i$, $l_j \in L$, if $l_i \leftrightarrows_\theta l_j$, instantiate the equation $\dot{\theta}(l_i) = \dot{\theta}(l_j)$ between $l_i$ and $l_j$ and add it to Z;

At step 806: For each $l_i$, $l_j \in L$, if $l_i \bowtie l_j$, instantiate the equation $\dot{p}(l_i) \cdot \sigma \leq \dot{l}_j(\rho(p(l_i),l_j)) \cdot \sigma$ between $l_i$ and $l_j$ and add it to Z;

At step 807: Instantiate the equation $\dot{E} = -1$ between all $l \in L$ and add it to Z; and At step 808: Pass Z to a linear programming solver as understood by one skilled in the art.

At step 810 a test is done to determine if Z has a feasible solution. The method outputs a designation indicating Unstable if there is a feasible solution (step 810a); otherwise the method outputs a designation indicating Stable (step 810b). These designations can take on any number of forms. Preferably, a binary logical value in which case 1 indicates a stable scene and a logical value of 0 indicates an unstable scene (or vice versa).

It will be apparent to those skilled in the art that the methods of the present invention disclosed herein may be embodied and performed completely by software contained in an appropriate storage medium for controlling a computer.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A method for determining the stability of a two dimensional polygonal scene, each polygon in the scene comprising data representing a set L of line segments comprised of individual line segments l, the method determines whether the line segments are stable under an interpretation I, where I is a quintuple $<g, \leftrightarrows_i, \leftrightarrows_j, \leftrightarrows_\theta, \bowtie>$ and where g is a property of line segments while $\leftrightarrows_i, \leftrightarrows_j, \leftrightarrows_\theta$, and $\bowtie$ are relations between pairs of line segments, the method comprising the steps of:

initializing a set Z of constraints to an empty set;

for each l contained in L, if g(l), instantiating $[\dot{c}(l)=0]$ and $[\dot{\theta}(l)=0]$ and adding them to Z;

for each $l_i$, $l_j$ contained in L, if $l_i \leftrightarrows_i l_j$, instantiating $[\dot{\rho}(I(l_i, l_j), l_j) = 0]$ between $l_i$ and $l_j$ and adding it to Z;

for each $l_i$, $l_j$ contained in L, if $l_i \leftrightarrows_j l_j$, instantiating $[\dot{\rho}(I(l_i, l_j), l_j) = 0]$ between $l_i$ and $l_j$ and adding it to Z;

for each $l_i$, $l_j$ contained in L, if $l_i \leftrightarrows_\theta l_j$, instantiating $[\dot{\theta}(l_i) = \dot{\theta}(l_j)]$ between $l_i$ and $l_j$ and adding it to Z;

for each $l_i$, $l_j$ contained in L, if $l_i \bowtie l_j$, instantiating $[\dot{p}(l_i) \cdot \sigma \leq \dot{l}_j(\rho(p(l_i), l_j)) \cdot \sigma]$ between $l_i$ and $l_j$ and adding it to Z;

instantiating $[\dot{E} = -1]$ between all l of L and adding it to Z; and determining the stability of the scene based upon whether Z has a feasible solution.

2. The method of claim 1, wherein the determining step comprises passing Z to a linear programming solver.

3. The method of claim 1, further comprising the step of outputting a logical value indicative of whether or not Z has a feasible solution.

4. The method of claim 3, wherein the logical value is a binary logical value.

5. The method of claim 4, wherein the outputting step comprises outputting a logical 0 if Z has a feasible solution and outputting a logical 1 if Z does not have a feasible solution.

6. A program storage device readable by machine, tangibly embodying a program of instructions executable by the machine to perform method steps for determining the stability of a two dimensional polygonal scene, each polygon in the scene comprising data representing a set L of line segments comprised of individual line segments l, the method determines whether the line segments are stable under an interpretation I, where I is a quintuple $<g, \leftrightarrows_i, \leftrightarrows_j, \leftrightarrows_\theta, \bowtie>$ and where g is a property of line segments while $\leftrightarrows_i, \leftrightarrows_j, \leftrightarrows_\theta$, and $\bowtie$ are relations between pairs of line segments, the method comprising the steps of:

initializing a set Z of constraints to an empty set;

for each l contained in L, if g(l), instantiating $[\dot{c}(l)=0]$ and $[\dot{\theta}(l)=0]$ and adding them to Z;

for each $l_i$, $l_j$ contained in L, if $l_i \leftrightarrows_i l_j$, instantiating $[\dot{\rho}(I(l_i, l_j), l_j) = 0]$ between $l_i$ and $l_j$ and adding it to Z;

for each $l_i$, $l_j$ contained in L, if $l_i \leftrightarrows_j l_j$, instantiating $[\dot{\rho}(I(l_i, l_j), l_j) = 0]$ between $l_i$ and $l_j$ and adding it to Z;

for each $l_i$, $l_j$ contained in L, if $l_i\leftrightarrows_\theta l_j$, instantiating [$\dot\theta(l_i)=\dot\theta(l_j)$] between $l_i$ and $l_j$ and adding it to Z;

for each $l_i$, $l_j$ contained in L, if $l_i\bowtie l_j$, instantiating [$\dot p(l_i)\cdot\sigma\leq \dot l_j(\rho(p(l_i),l_j))\cdot\sigma$] between $l_i$ and $l_j$ and adding it to Z;

instantiating [$\dot E=-1$] between all l of L and adding it to Z; and determining the stability of the scene based upon whether Z has a feasible solution.

7. The method of claim 6, wherein the determining step comprises passing Z to a linear programming solver.

8. The method of claim 6, further comprising the step of outputting a logical value indicative of whether or not Z has a feasible solution.

9. The method of claim 8, wherein the logical value is a binary logical value.

10. The method of claim 9, wherein the outputting step comprises outputting a logical 0 if Z has a feasible solution and outputting a logical 1 if Z does not have a feasible solution.

11. A computer program product embodied in a computer-readable medium for determining the stability of a two dimensional polygonal scene, each polygon in the scene comprising data representing a set L of line segments comprised of individual line segments l, the method determines whether the line segments are stable under an interpretation I, where I is a quintuple (g, $\leftrightarrows_i$, $\leftrightarrows_j$, $\leftrightarrows_\theta$, $\bowtie$) and where g is a property of line segments while $\leftrightarrows_i$, $\leftrightarrows_j$, $\leftrightarrows_\theta$, and $\bowtie$ are relations between pairs of line segments, the computer program product comprising:

computer readable program code means for initializing a set Z of constraints to an empty set;

for each l contained in L, if g(l), computer readable program code means for instantiating [$\dot c(l)=0$] and [$\dot\theta(l)=0$] and adding them to Z;

for each $l_i$, $l_j$ contained in L, if $l_i\leftrightarrows_i l_j$, computer readable program code means for instantiating [$\rho(I(l_i,l_j),l_i)=0$] $l_i$ and $l_j$ and adding it to Z;

for each $l_i$, $l_j$ contained in L, if $l_i\leftrightarrows_j l_j$, computer readable program code means for instantiating [$\rho(I(l_i,l_j),l_j)=0$] between $l_i$ and $l_j$ and adding it to Z;

for each $l_i$, $l_j$ contained in L, if $l_i l\leftrightarrows_\theta l_j$, computer readable program code means for instantiating [$\dot\theta(l_i)=\dot\theta(l_j)$] between $l_i$ and $l_j$ and adding it to Z;

for each $l_i$, $l_j$ contained in L, if $l_i\bowtie l_j$, computer readable program code means for instantiating [$\dot p(l_i)\cdot\sigma\leq \dot l_j(\rho(p(l_i),l_j))\cdot\sigma$] between $l_i$ and $l_j$ and adding it to Z;

computing readable program code means for instantiating [$\dot E=-1$] between all l of L and adding it to Z; and computer readable program code means for determining the stability of the scene based upon whether Z has a feasible solution.

12. The computer program product of claim 11, wherein the computer readable program code means for determining the stability of the scene comprises computer readable program code means for passing Z to a linear programming solver.

13. The computer program product of claim 11, further comprising computer readable program code means for outputting a logical value indicative of whether or not Z has a feasible solution.

14. The computer program product of claim 13, wherein the logical value is a binary logical value.

15. The computer program product of claim 14, wherein the computer readable program code means for outputting a logical value indicative of whether or not Z has a feasible solution comprises computer readable program code means for outputting a logical 0 if Z has a feasible solution and outputting a logical 1 if Z does not have a feasible solution.

* * * * *